United States Patent

Liu

[11] Patent Number: 5,943,218
[45] Date of Patent: Aug. 24, 1999

[54] CARD TYPE CPU-FIXING STRUCTURE

[76] Inventor: Yen-Wen Liu, 13 Fl., No. 90, Chiu Kang St., Wen Shan Dist., Taipei, Taiwan

[21] Appl. No.: 09/088,000

[22] Filed: Jun. 1, 1998

[51] Int. Cl.$^6$ .................................................. H05K 7/12
[52] U.S. Cl. .......................... 361/801; 361/683; 361/785; 361/802; 439/327
[58] Field of Search .................................. 361/683, 740, 361/741, 759, 785, 788, 801, 802; 439/325, 327, 331, 366

[56] References Cited

U.S. PATENT DOCUMENTS

| | | | |
|---|---|---|---|
| 3,662,224 | 5/1972 | Rauch | 361/741 |
| 5,317,481 | 5/1994 | Hillis et al. | 361/759 |
| 5,642,263 | 6/1997 | Lauruhn | 361/801 |

Primary Examiner—Leo P. Picard
Assistant Examiner—John B. Vigushin
Attorney, Agent, or Firm—Bacon & Thomas, PLLC

[57] ABSTRACT

The present invention relates to a card type CPU fixing structure, characterized in that when said card type CPU (CELERON) is inserted in the main board of Pentium II framework, there is no need to change the support seat. All the user has to do is to fasten the fixing cover on the support seat, the channel on the inside of the fixing cover will press the card type CPU (CELERON) in position, so the card type CPU (CELERON) will not wobble. With the invention, the interchange between a cartridge type Pentium II CPU and a card type CPU (CELERON) can be made readily without having to replace the support seat of the main board. With the invention, the manufacturers of main boards will not have to produce additional compatible components after the card type CPU (CELERON) is put on the market, while the user will be able to replace the CPU easily and readily.

3 Claims, 4 Drawing Sheets

CARD TYPE CPU-FIXING STRUCTURE

FIELD OF THE INVENTION

The present invention relates to a card type CPU fixing structure, particularly to one fixing cover that is easily installed or disassembled, that enables compatible application for a card type CPU and a cartridge type Pentium II CPU without having to amend the main board.

BACKGROUND OF THE INVENTION

With continued development of science and technology in recent years, we have seen many innovated appliances and components related to personal computers. A personal computer's data processing speed relies on the performance of its central processing unit (CPU) which has advanced from 16 bytes to 64 bytes in a few years. Due to increasing data processing speeds, the Socket1–Socket7 of CPU structure in the early stages has been replaced by SLOT1 Pentium II specifications. Therefore, a computer main board must be innovated continually to suit different specifications of its CPU versions.

At the present when the SLOT1 Pentium II specifications have been put to the market for promotional sales, Intel has again introduced another new version of so-called low-priced Pentium II CPU (also known as CELERON). Though both CELERON and Pentium II CPU versions involve SLOT1 and are applicable to a same type of main board, their configurational outlines are not the same. A Pentium II CPU includes a casing and is shaped as a cartridge, while a CELERON includes no casing and is shaped as a card. For the purpose of securing a cartridge type CPU, the main board that was applicable to a cartridge type Pentium II CPU has been amended to include support seats with a same thickness with the cartridge type CPU at two ends of the main board CPU slot, so that the cartridge type CPU will not wobble. Now that the card type CPU (CELERON) has been put on the market, since its thickness is quite different from that of a cartridge type CPU, there must be separate production of the support seats to suit the application.

To enable the application of different outlines of cartridge type CPU and card type CPU, the main board manufacturers have to make additional molds for the production of a set of support seats for the manufacturers or the users to make the replacement. To replace the CPU, the user will have to dismantle the whole computer set, remove the main board, replace the support seats, and reassemble the whole set. The result is too much trouble for both the manufacturer and the user, and its application is not consistent with economic efficiency.

SUMMARY OF THE INVENTION

The primary objective of the present invention is to present a simplified type of CPU fixing structure to enable compatible installation and fixation of a cartridge type Pentium II CPU or a card type CPU without having to change the support seats on the main board.

The secondary objective of the present invention is to present a fixing structure that is applicable to different distances of support seats that are produced by different molds.

The technical contents and embodiment examples of the invention are described below with drawings.

BRIEF DESCRIPTION OF DRAWINGS

FIG. 4 B is another embodiment view of the invention.

DETAILED DESCRIPTION OF PREFERRED EMBODIMENT

Figure 1:
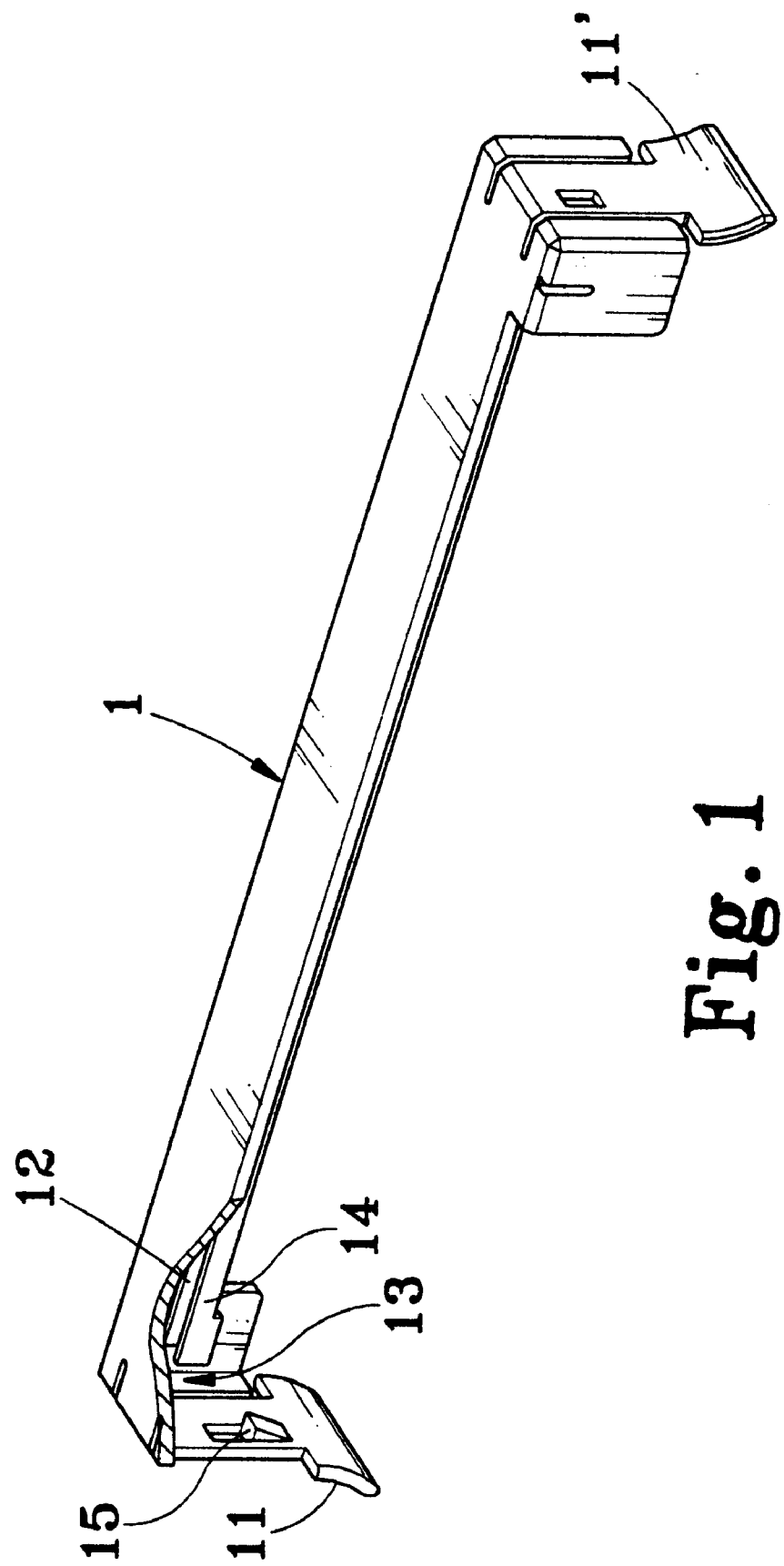
FIG. 1 is a perspective view of the invention.
Figure 2:
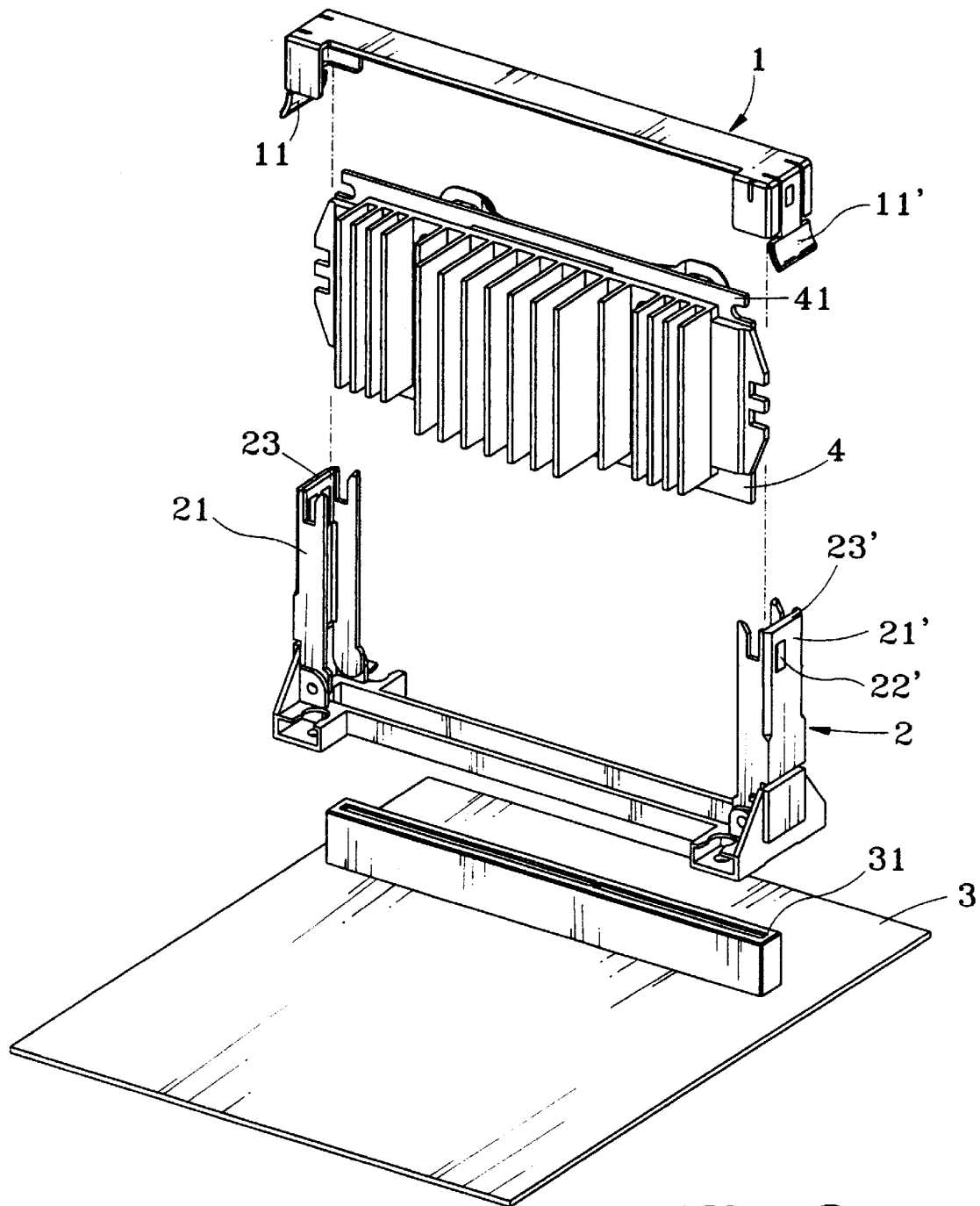
FIG. 2 is an exploded view of the invention in application.

Please refer to FIG. 1 which illustrates the structure of a partial perspective view of the invention, comprising the following components:

A main unit 1 to be attached onto a support seat 2, on two ends of said main unit 1 is the formation of stop plates 11,11' that can be fastened onto the support racks 21,21' on the support seat 2, on the inside of said main unit 1 is a channel 12 that can press the dented end 41 of the card type CPU 4 in position, as shown in FIG. 2. Since the support seat 2 is to be fastened on the outside of the CPU slot 31 on the main board 3, the card type CPU 4 will be inserted in the CPU slot 31, then the two stop plates 11,11' at two ends of the main unit 1 will be fastened to the support racks 21,21' on two ends of the support seat 2, so said dented ends 41 will be inserted in the channel 12; besides, on the stop plates 11,11' are check pieces 15,15', when said check pieces 15,15' are accommodated in the check holes 22,22' on the support racks 21,21', the unit can be fixed in position.

Figure 3:
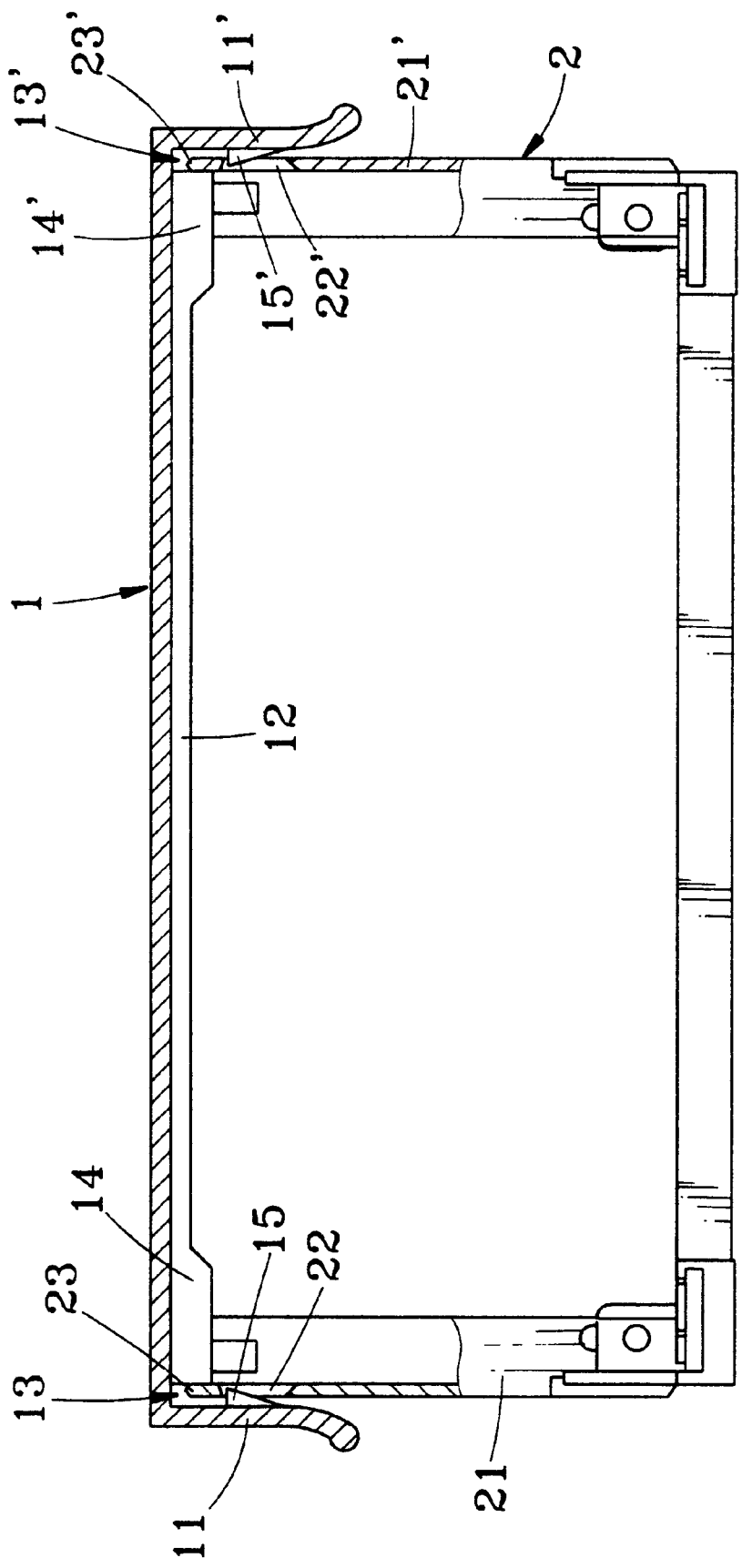
FIG. 3 is an assembled side view of the invention.

As shown in FIG. 3 which illustrates an assembled side view of the invention, between the limiting blocks 14,14' at two ends of the channel 12 and the stop plates 11,11' are stop check parts 13,13', when the main unit 1 is mounted on the support seat 2, the positioning ends 23,23' on the support racks 21,21' will be inserted into said stop check parts 13,13', and located between the stop plates 11,11' and the limiting blocks 14,14'.

Figure 4A:
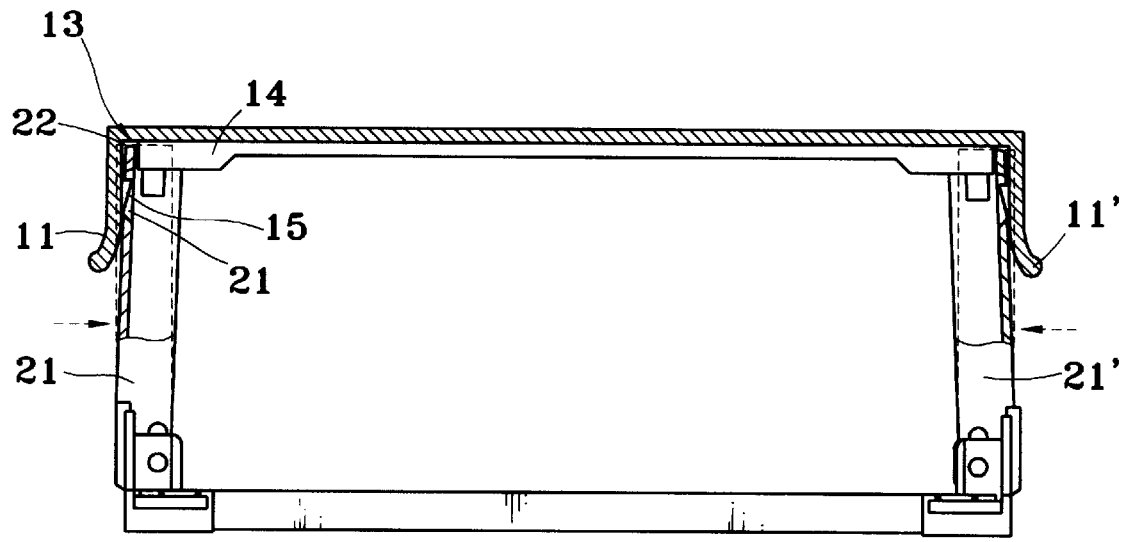
FIG. 4 A is an embodiment view of the invention.

Please refer to FIG. 4A which is another embodiment view of the invention. The drawing shows that when the distance between the two support racks 21,21' is larger, since the main unit 1 and the support seat 2 are made of flexible materials, the assembled support racks 21,21' will stretch out the stop plates 11,11' at two ends, meanwhile the stop plates 11,11' will squeeze in the two support racks 21,21', thus the objective of the invention can be achieved.

Figure 4B:
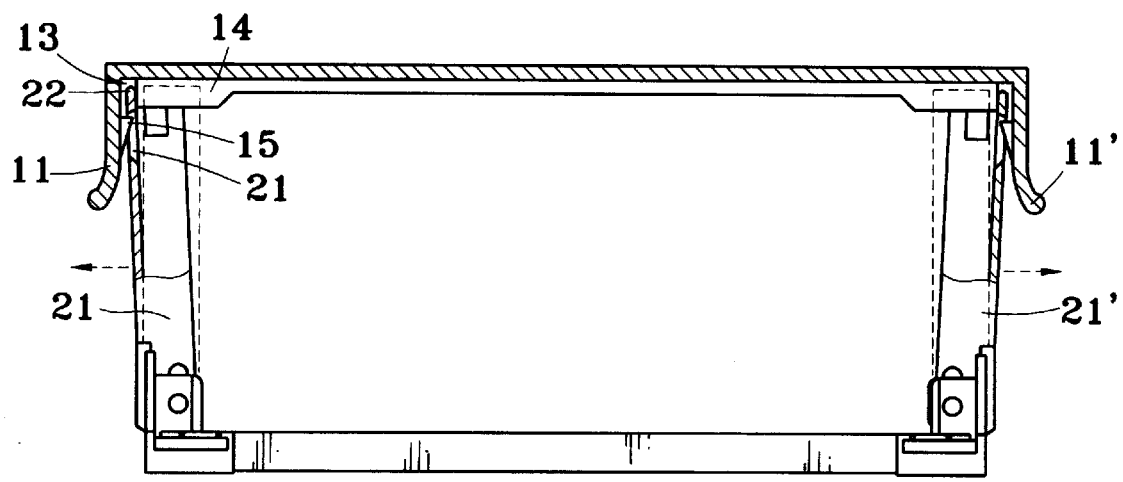

Please refer to FIG. 4B which is another embodiment view of the invention. The drawing shows that when the distance between the two support racks 21,21' is smaller, when assembled the positioning ends 23,23' of the support racks 21,21' are stretched by the limiting blocks 14,14' at two ends of the channel 12, to guide the support racks 21,21' into the stop check parts 13,13', thus the objective of the invention can be achieved.

Summing up, the fixing structure of the card type CPU presented in the subject invention has its applicability and originality, yet the above description, has covered only the preferred embodiment of the subject matter, therefore it should not be based to limit or restrict the subject claim, and that all equivalent structural and/or configurational variations and/or modifications shall be included in the intent of the subject claim.

I claim:

1. A card type CPU fixing structure that is fastened onto the support seat that is mounted on the CPU slot on a main board, said fixing structure involving a main unit, at two ends of the main unit being stop plates that can be fastened to the support racks on the support seat, on the inside of said main unit being a channel that will press the dented end of the card type CPU in position; said fixing structure serves to fasten the card type CPU securely on the support seat on a Pentium II framework, to enable replacement of different CPUs by the user.

2. The card type CPU fixing structure as recited in claim 1, wherein on said stop plates are check pieces that serve to match the check holes on the support racks.

3. The card type CPU fixing structure as recited in claim 1, wherein at two ends of the channel are limiting blocks, between said limiting blocks and stop plates being stop check parts that, after the main unit is fastened to the support seat, serve to enable the positioning ends installed on the support racks to be inserted in said stop check parts, and located between the stop plates and the limiting blocks.

* * * * *